(12) United States Patent
Kojima

(10) Patent No.: US 10,654,071 B2
(45) Date of Patent: May 19, 2020

(54) ULTRASONIC ELEMENT ARRAY, ULTRASONIC PROBE, ULTRASONIC APPARATUS, AND MANUFACTURING METHOD FOR ULTRASONIC ELEMENT ARRAY

(71) Applicant: Seiko Epson Corporation, Tokyo (JP)

(72) Inventor: Chikara Kojima, Matsumoto (JP)

(73) Assignee: Seiko Epson Corporation (JP)

( * ) Notice: Subject to any disclaimer, the term of this patent is extended or adjusted under 35 U.S.C. 154(b) by 437 days.

(21) Appl. No.: 15/437,910

(22) Filed: Feb. 21, 2017

(65) Prior Publication Data
US 2017/0252778 A1   Sep. 7, 2017

(30) Foreign Application Priority Data
Mar. 7, 2016   (JP) .................................. 2016-043086

(51) Int. Cl.
| H01L 27/20 | (2006.01) |
| H01L 41/09 | (2006.01) |
| H01L 41/25 | (2013.01) |
| H01L 41/293 | (2013.01) |
| H01L 41/047 | (2006.01) |
| H01L 41/053 | (2006.01) |

(Continued)

(52) U.S. Cl.
CPC ............ B06B 1/0629 (2013.01); H01L 27/20 (2013.01); H01L 41/0475 (2013.01); H01L 41/0533 (2013.01); H01L 41/09 (2013.01); H01L 41/25 (2013.01); H01L 41/293 (2013.01); H01L 41/0973 (2013.01)

(58) Field of Classification Search
CPC ......................... B06B 1/0629; H01L 41/0475
USPC ......... 310/317, 363–366, 358, 328, 311, 322
See application file for complete search history.

(56) References Cited

U.S. PATENT DOCUMENTS 4,756,808 A  *  7/1988  Utsumi .................. B06B 1/067
                                                 310/334
2008/0089181 A1    4/2008  Adachi et al.
(Continued)

FOREIGN PATENT DOCUMENTS

| JP | 02-063443 A | 3/1990 |
| JP | 2008-118631 A | 5/2008 |

(Continued)

*Primary Examiner* — Thomas M Dougherty
*Assistant Examiner* — Karen B Addison
(74) *Attorney, Agent, or Firm* — Harness, Dickey & Pierce, P.L.C.

(57) ABSTRACT

An ultrasonic element array includes a first piezoelectric element, a second piezoelectric element, a third piezoelectric element, and a fourth piezoelectric element each having a piezoelectric material sandwiched by a first electrode and a second electrode, a first wire connecting the second electrode of the first piezoelectric element and the second electrode of the second piezoelectric element, a second wire connecting the second electrode of the third piezoelectric element and the second electrode of the fourth piezoelectric element, a third wire connecting to the second wire over the first wire, and an insulating film located between the first wire and the third wire, wherein the insulating film has an inorganic insulating film made of an inorganic material and an organic insulating film made of an organic material, and the inorganic insulating film covers the piezoelectric elements.

15 Claims, 11 Drawing Sheets

(51) Int. Cl.
*B06B 1/06* (2006.01)
*B60B 1/06* (2006.01)

(56) References Cited

U.S. PATENT DOCUMENTS

| | | | |
|---|---|---|---|
| 2011/0062824 A1* | 3/2011 | Wada | B06B 1/0622 |
| | | | 310/334 |
| 2014/0241112 A1 | 8/2014 | Kano | |
| 2018/0132824 A1* | 5/2018 | Tsuruno | G01S 15/8925 |

FOREIGN PATENT DOCUMENTS

| JP | 2011-137768 A | 7/2011 |
|---|---|---|
| JP | 2014-161707 A | 9/2014 |

* cited by examiner

ULTRASONIC ELEMENT ARRAY, ULTRASONIC PROBE, ULTRASONIC APPARATUS, AND MANUFACTURING METHOD FOR ULTRASONIC ELEMENT ARRAY

CROSS-REFERENCE TO RELATED APPLICATIONS

The present application is based on, and claims priority from, Japanese Patent Application No. 2016-043086, filed Mar. 7, 2016, the disclosure of which is hereby incorporated by reference herein in its entirety.

BACKGROUND

1. Technical Field

The present invention relates to an ultrasonic element array, an ultrasonic probe, an ultrasonic apparatus, and a manufacturing method for an ultrasonic element array.

2. Related Art

Piezoelectric materials that deform by application of voltages are widely known. Two or more electrodes are provided in the piezoelectric material. When a voltage is applied between the electrodes, the piezoelectric material deforms. Further, when the piezoelectric material deforms, a potential difference is generated between the two electrodes. Ultrasonic waves may be generated using the nature of the piezoelectric material. Furthermore, when the piezoelectric material receives the ultrasonic waves and vibrates, the ultrasonic waves may be detected by detection of fluctuations of the potential difference between the electrodes.

Patent Document 1 (JP-A-2011-137768) discloses an ultrasonic element array in which piezoelectric elements including piezoelectric materials with electrodes are arranged in an array form. The piezoelectric materials are plate-like shapes having front surfaces and back surfaces in parallel. The planar shapes of the piezoelectric materials are rectangular shapes and the electrodes are provided on both surfaces of the piezoelectric materials. One of the electrodes is a common electrode provided on all of the piezoelectric materials and set at the same potential. The other electrodes are individual electrodes provided on the respective piezoelectric materials. The wires are provided with respect to each individual electrode.

In the ultrasonic element array in Patent Document 1, the piezoelectric elements are arranged in five rows and five columns. Further, terminals are provided on four sides of up, down, left, right sides of the arrangement and the terminals and the individual electrodes are connected by wires. In this case, it is possible to place the wires not to cross one another. When the terminals are provided on the four sides of the arrangement, locations where the terminals are provided are necessary on the four sides of the arrangement. On the other hand, when the terminals are provided on the two opposed sides of the arrangement, the width of the array of the piezoelectric elements may be made shorter. In this case, locations where the wires connecting the terminals and the individual electrodes cross are necessary. Further, when the number of rows or columns of the piezoelectric elements is large, the locations where the wires connecting the terminals and the individual electrodes cross are necessary.

The ultrasonic elements are driven by a voltage of about 30 volts. In the locations where the wires connecting the terminals and the individual electrodes cross, insulating films are provided between the wires. Usually, inorganic films made of an inorganic material having a moisture-resistant property are used for the insulating films between the wires. In this case, currents may leak between the wires because the inorganic films are thin. Accordingly, an ultrasonic element array in which resistance to moisture and voltage may be improved even in the layout of the crossing wires is desired.

SUMMARY

An advantage of some aspects of the invention is to solve the problems described above, and the invention can be implemented as the following forms or application examples.

Application Example 1

An ultrasonic element array according to this application example includes a first piezoelectric element, a second piezoelectric element, a third piezoelectric element, and a fourth piezoelectric element each having a piezoelectric material sandwiched by two electrodes, a first wire connecting the first piezoelectric element and the second piezoelectric element, a second wire connecting the third piezoelectric element and the fourth piezoelectric element, a third wire connecting to the second wire over the first wire, and an insulating film located between the first wire and the third wire, wherein the insulating film has an inorganic film made of an inorganic material and an organic film made of an organic material, and the inorganic film covers the piezoelectric elements.

According to this application example, the ultrasonic element array includes the first piezoelectric element to the fourth piezoelectric element, and the piezoelectric material is sandwiched by the two electrodes in each piezoelectric element. A voltage having a predetermined waveform is applied between the two electrodes, and thereby, the piezoelectric material vibrates and outputs ultrasonic waves. The first wire connects the first piezoelectric element and the second piezoelectric element. The second wire connects the third piezoelectric element and the fourth piezoelectric element. The third wire connects to the second wire over the first wire. The insulating film is located between the first wire and the third wire so that the first wire and the third wire may not be short-circuited by the insulating film.

The insulating film has the inorganic film made of the inorganic material and the organic film made of the organic material. The inorganic film has moisture resistance and prevents passing of moisture. The organic film is a thicker film than the inorganic film and has electrical resistance to voltage. Accordingly, short-circuit between the first wire and the third wire may be made harder. Further, the inorganic film covers the piezoelectric elements. When moisture penetrates the piezoelectric elements, the vibration characteristics are deteriorated. The inorganic film suppresses penetration of moisture into the piezoelectric elements. Therefore, the ultrasonic element array may have improved resistance to moisture and voltage.

Application Example 2

In the ultrasonic element array according to the application example, the organic film is provided between the adjacent piezoelectric materials.

According to this application example, the organic film is provided between the adjacent piezoelectric materials, and provided in the location not facing the piezoelectric elements. When the organic film overlaps with the piezoelectric elements, the organic film serves as a vibration resistance. In the application example, the organic film does not overlap with the piezoelectric elements, and thereby, the piezoelectric elements may efficiently output ultrasonic waves.

Application Example 3

In the ultrasonic element array according to the application example, the organic film is provided on the inorganic film.

According to this application example, the organic insulating film is provided on the inorganic film. It is difficult to provide the inorganic film on the organic insulating film, but easy to provide the organic film on the inorganic film. Therefore, the insulating film may be provided with higher productivity.

Application Example 4

In the ultrasonic element array according to the application example, the piezoelectric elements including the first piezoelectric element, the second piezoelectric element, the third piezoelectric element, and the fourth piezoelectric element are arranged in a matrix form, and a single wire is provided between the first piezoelectric element and the second piezoelectric element.

According to this application example, the plurality of piezoelectric elements are arranged in the matrix form. Further, only one wire is provided between the first piezoelectric element and the second piezoelectric element. Accordingly, the area occupied by the wires may be made smaller compared to the arrangement in which the plurality of wires are provided between the first piezoelectric element and the second piezoelectric element. Therefore, density of the piezoelectric elements may be made higher.

Application Example 5

In the ultrasonic element array according to the application example, the piezoelectric elements including the first piezoelectric element and the third piezoelectric element are arranged in a row direction and the piezoelectric elements including the first piezoelectric element and the second piezoelectric element are arranged in a column direction orthogonal to the row direction, and a fourth wire extending in a first direction of the row direction or a fifth wire separated from the fourth wire and extending in a second direction opposite to the first direction is provided between the rows of the adjacent piezoelectric elements.

According to this application example, the piezoelectric elements are arranged in the row direction and the column direction. Further, the fourth wire or the fifth wire is provided between the rows of the adjacent piezoelectric elements. The fourth wire extends in the first direction of the row direction and the fifth wire extends in the second direction opposite to the first direction. Therefore, the wires located between the rows function as two series of wires of the fourth wire and the fifth wire. The first wire and the second wire are wires extending in the column direction. Further, the fourth wire and the fifth wire are connected to the wires extending in the column direction. Therefore, the wires located between the rows may conduct different voltages in the piezoelectric elements in the different columns extending in the column direction.

Application Example 6

An ultrasonic probe according to this application example includes an ultrasonic element array that outputs ultrasonic waves, in which the ultrasonic element array is the ultrasonic element array according to any one of the application examples.

According to this application example, the ultrasonic probe includes the ultrasonic element array that outputs ultrasonic waves. Further, for the ultrasonic element array, the above described ultrasonic element array is used. The ultrasonic element array has higher resistance to moisture and voltage. Therefore, the ultrasonic probe may be an apparatus including the ultrasonic element array having higher resistance to moisture and voltage.

Application Example 7

An ultrasonic apparatus according to this application example includes an ultrasonic element array that outputs ultrasonic waves, in which the ultrasonic element array is the ultrasonic element array according to any one of the application examples.

According to this application example, the ultrasonic apparatus includes the ultrasonic element array that outputs ultrasonic waves. Further, for the ultrasonic element array, the above described ultrasonic element array is used. The ultrasonic element array has higher resistance to moisture and voltage. Therefore, the ultrasonic apparatus may be an apparatus including the ultrasonic element array having higher resistance to moisture and voltage.

Application Example 8

A manufacturing method for an ultrasonic element array according to this application example includes providing an inorganic film made of an inorganic material on a first wire connecting to respective electrodes of a plurality of piezoelectric elements each having a piezoelectric material sandwiched by two of the electrodes and the piezoelectric elements, providing an organic film made of an organic material on parts of the inorganic film between the adjacent piezoelectric elements, and providing a third wire on the organic film.

According to this application example, the plurality of piezoelectric elements are provided. In each piezoelectric element, the piezoelectric material is sandwiched by the two electrodes. Further, the electrodes of the respective piezoelectric elements are connected by the first wire. The inorganic film made of the inorganic material is provided on the first wire and the piezoelectric elements. Then, the organic film made of the organic material is provided on the inorganic film. The organic film is provided in a location not facing the piezoelectric elements, but facing the first wire. Then, the third wire is provided. The third wire is provided on the organic film.

The insulating film including the inorganic film and the organic film is provided between the third wire and the first wire and short circuit is suppressed. Further, the inorganic film is provided on the piezoelectric elements, and entry of moisture into the piezoelectric elements is suppressed. The inorganic film provided on the piezoelectric elements and the inorganic film provided on the first wire are provided at the same step. Accordingly, the number of steps may be reduced compared to the case where the inorganic film provided on the piezoelectric elements and the inorganic film provided on the first wire are provided at different steps. Therefore, the ultrasonic element array harder to be short-circuited may be manufactured with higher productivity.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

As below, embodiments will be explained with reference to the drawings. Note that the respective members in the respective drawings are shown in different scales with respect to each member so that their sizes may be recognizable on the respective drawings.

First Embodiment

Figure 1:
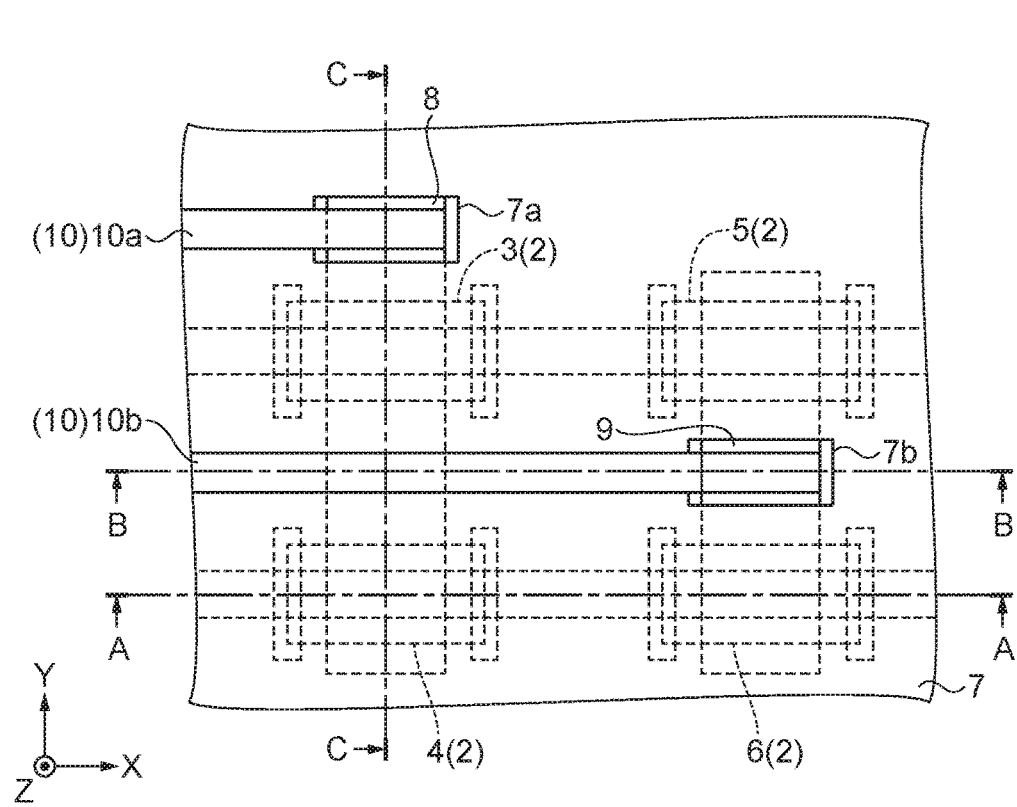
FIG. 1 is a main part schematic plan view for explanation of a structure of an ultrasonic element array according to the first embodiment.

In the embodiment, characteristic examples of an ultrasonic element array and a manufacturing method for the ultrasonic element array will be explained with reference to the drawings. The ultrasonic element array according to the first embodiment will be explained with reference to FIGS. 1 to 7. FIG. 1 is a main part schematic plan view for explanation of a structure of the ultrasonic element array. As shown in FIG. 1, the ultrasonic element array 1 includes piezoelectric elements 2 arranged in a matrix form. The directions in which the piezoelectric elements 2 are arranged are an X-direction and a Y-direction. The direction orthogonal to the X-direction and the Y-direction is a Z-direction.

Parts of the piezoelectric elements 2 include a first piezoelectric element 3, a second piezoelectric element 4, a third piezoelectric element 5, and a fourth piezoelectric element 6. The first piezoelectric element 3 and the third piezoelectric element 5 are arranged in the X-direction, and the second piezoelectric element 4 and the fourth piezoelectric element 6 are arranged in the X-direction. The group of the piezoelectric elements 2 arranged in the X-direction is referred to as "row". The first piezoelectric element 3 and the second piezoelectric element 4 are arranged in the Y-direction, and the third piezoelectric element 5 and the fourth piezoelectric element 6 are arranged in the Y-direction. The group of the piezoelectric elements 2 arranged in the Y-direction is referred to as "column".

An inorganic insulating film 7 as an inorganic film is provided on the piezoelectric elements 2. In the inorganic insulating film 7, first opening portions 7a and second opening portions 7b are provided. A first wire 8 as a wire is exposed from one of the first opening portion 7a and a second wire 9 as a wire is exposed from the second opening portion 7b. The first wire 8 and the second wire 9 are wires extending in the Y-direction. The piezoelectric function of the piezoelectric elements 2 is deteriorated due to entry of moisture. The inorganic insulating film 7 is a film hard to pass moisture and suppresses the deterioration of the piezoelectric function of the piezoelectric elements 2.

On the inorganic insulating film 7, third wires 10 including a third wire 10a and a third wire 10b are provided. The third wires 10 in the drawing are part of the third wires 10. Further, the third wire 10a and the first wire 8 are connected in the first opening portion 7a and the third wire 10b and the second wire 9 are connected in the second opening portion 7b.

Figure 2:
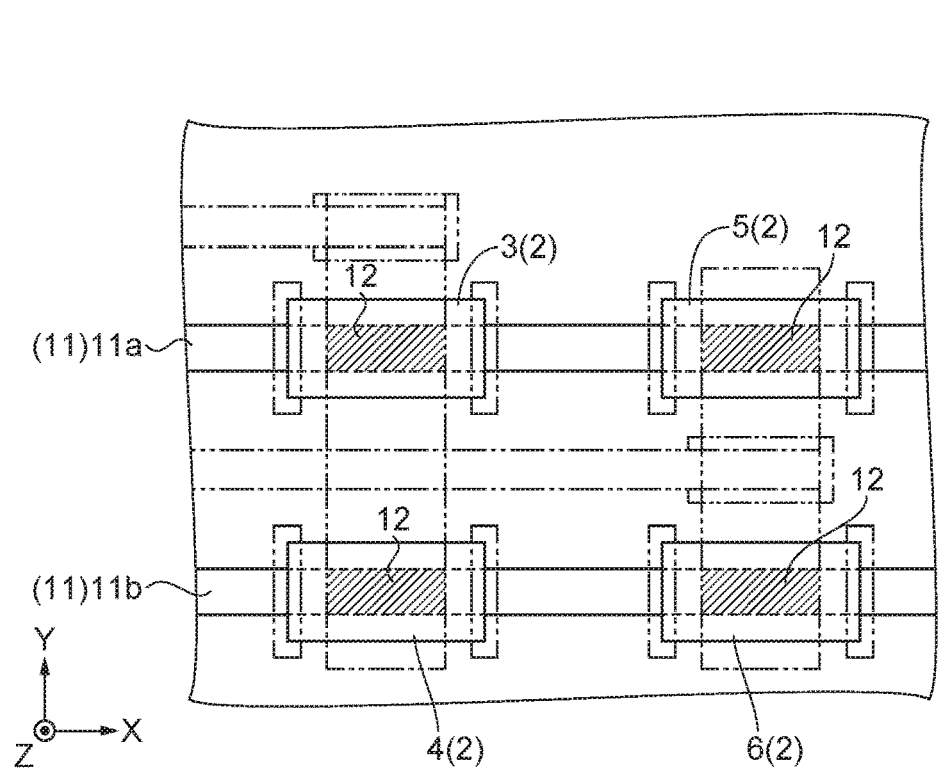
FIG. 2 is a main part schematic plan view for explanation of lower wires.

FIG. 2 is a main part schematic plan view for explanation of lower wires. As shown in FIG. 2, lower wires 11 including a lower wire 11a and a lower wire 11b are provided in the ultrasonic element array 1. The lower wires 11 in the drawing are part of the lower wires 11. The lower wire 11a connects to the first piezoelectric element 3 and the third piezoelectric element 5, and the lower wire 11b connects to the second piezoelectric element 4 and the fourth piezoelectric element 6. The parts of the lower wires 11 in the parts connected to the piezoelectric elements 2 function as first electrodes 12 as electrodes. The shaded parts in the drawing show the first electrodes 12.

Figure 3:
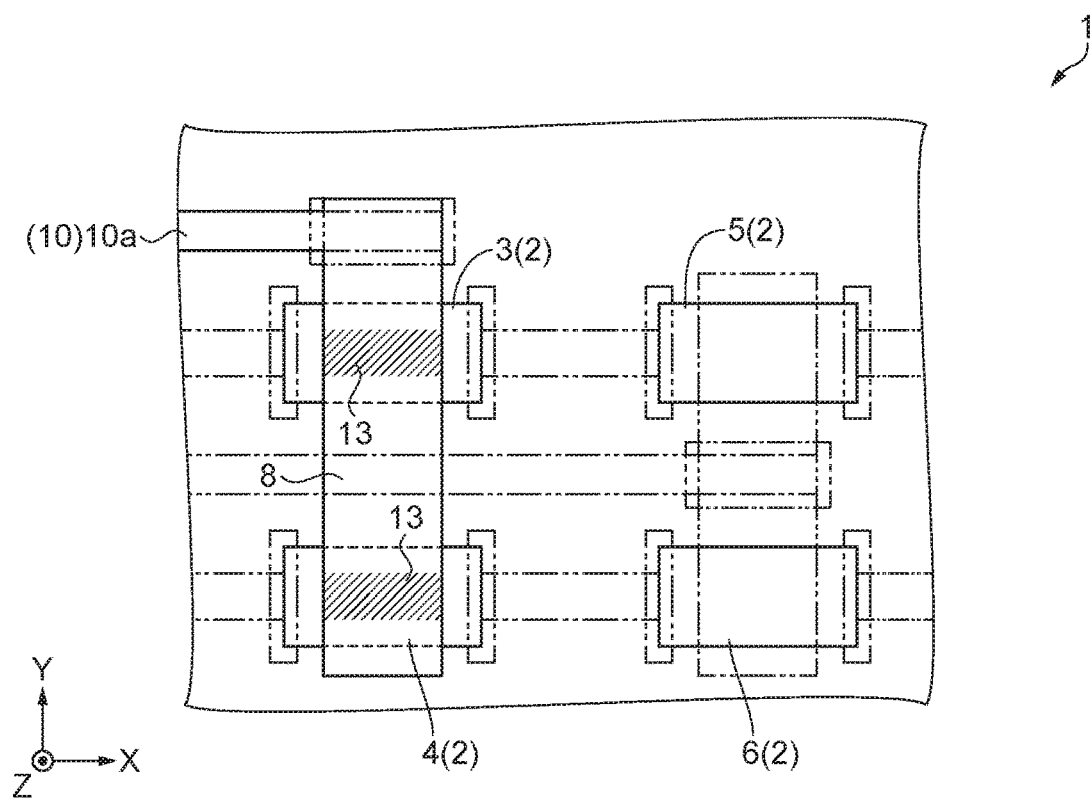
FIG. 3 is a main part schematic plan view for explanation of a first wire.

FIG. 3 is a main part schematic plan view for explanation of the first wire. As shown in FIG. 3, the third wire 10a and the first wire 8 are connected and the first wire 8 is connected to the first piezoelectric element 3 and the second piezoelectric element 4. Parts of the first wire 8 connected to the piezoelectric elements 2 function as second electrodes 13 as electrodes. The shaded parts in the drawing show the second electrodes 13. Therefore, the first wire 8 connects the second electrode 13 of the first piezoelectric element 3 and the second electrode 13 of the second piezoelectric element 4. The first electrode 12 and the second electrode 13 are provided to face each other. A voltage is supplied to the second electrodes 13 through the third wire 10a and the first wire 8.

Figure 4:
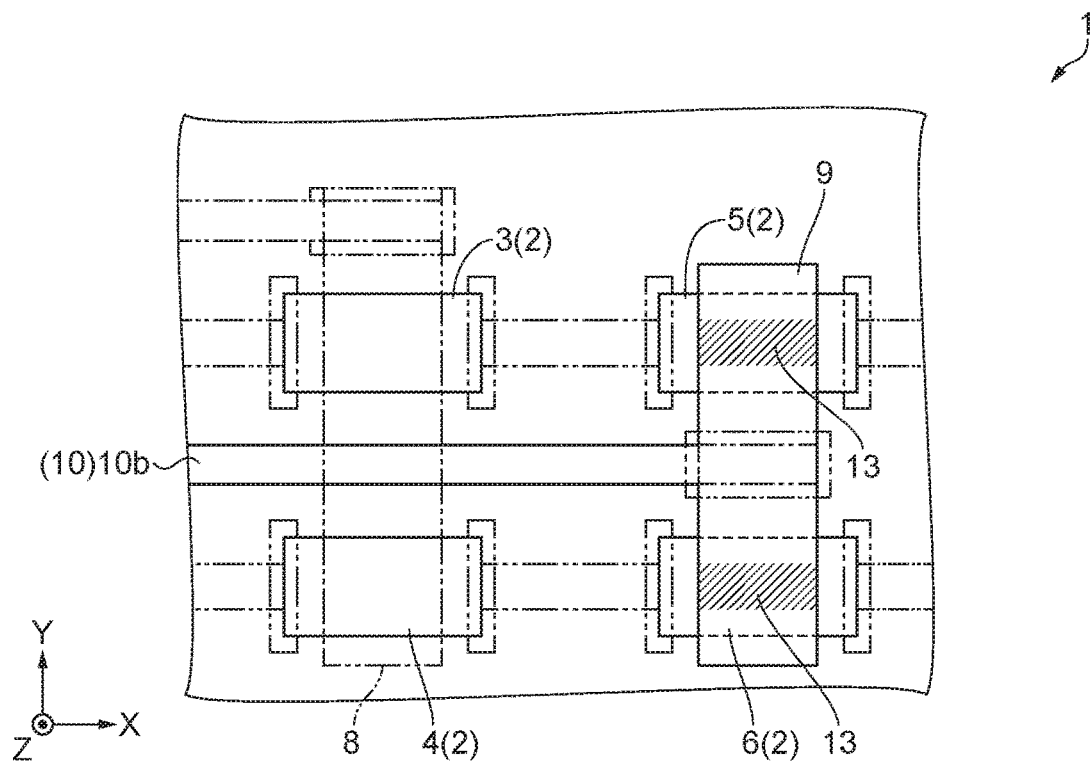
FIG. 4 is a main part schematic plan view for explanation of a second wire.

FIG. 4 is a main part schematic plan view for explanation of the second wire. As shown in FIG. 4, the third wire 10b and the second wire 9 are connected and the second wire 9 is connected to the third piezoelectric element 5 and the fourth piezoelectric element 6. Parts of the second wire 9 in the parts connected to the piezoelectric elements 2 function as the second electrodes 13. The shaded parts in the drawing show the second electrodes 13. Therefore, the second wire 9 connects the second electrode 13 of the third piezoelectric element 5 and the second electrode 13 of the fourth piezoelectric element 6. The first electrode 12 and the second electrode 13 are provided to face each other. A voltage is supplied to the second electrodes 13 through the third wire 10b and the second wire 9. The third wire 10b is provided to cross the first wire 8 and connects to the second wire 9 over the first wire.

Figure 5:
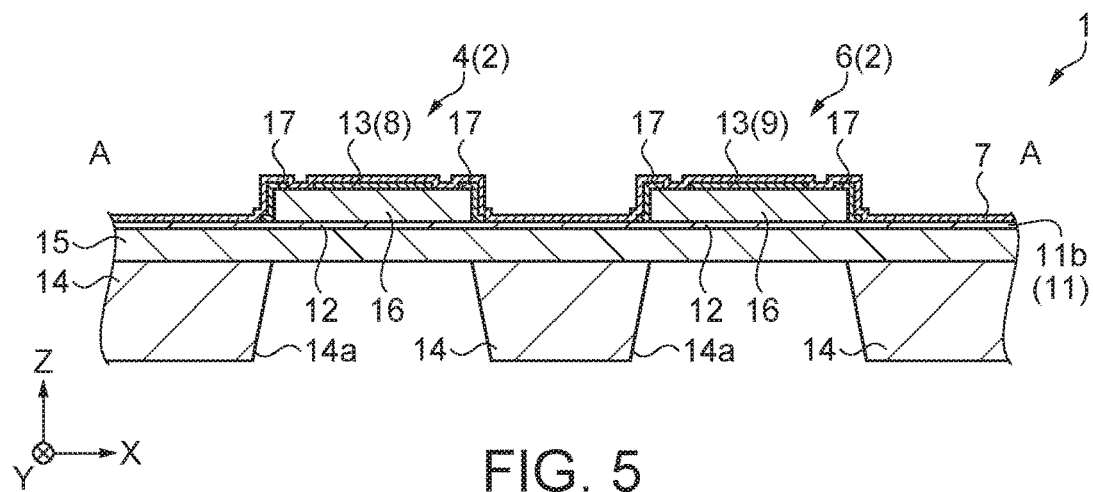
FIG. 5 is a main part schematic side sectional view showing the structure of the ultrasonic element array.

FIG. 5 is a main part schematic side sectional view showing the structure of the ultrasonic element array as seen from the section along line A-A in FIG. 1. As shown in FIG. 5, the ultrasonic element array 1 includes a substrate 14. The material of the substrate 14 is not particularly limited as long as it has rigidity and may be precisely processed. In the embodiment, for example, a silicon substrate is used for the material of the substrate 14.

A vibrating plate 15 is provided on the substrate 14. The vibrating plate 15 is a part that vibrates and generates ultrasonic waves. The material of the vibrating plate 15 is not particularly limited as long as it has good vibration characteristics. It is preferable that the vibrating plate 15 has an insulation property. In the embodiment, for example, silicon dioxide or zirconium dioxide is used for the material of the vibrating plate 15. In the substrate 14, concave portions 14a are provided in locations facing the piezoelectric elements 2. In the concave portions 14a, the vibrating plate 15 is exposed. Thereby, the vibrating plate 15 easily vibrates.

The lower wire 11b is provided on the vibrating plate 15. The lower wire 11b is a wire extending in the X-direction. For the lower wire 11b, a film in which an iridium film and a platinum film are stacked is used. On the lower wire 11b, rectangular piezoelectric materials 16 are provided. The material forming the piezoelectric materials 16 is not particularly limited, but, in the embodiment, for example, PZT (lead zirconate titanate) is used.

In the second piezoelectric element 4, the first wire 8 extending in the Y-direction is provided on the piezoelectric material 16. In the first wire 8, the parts facing the piezoelectric materials 16 are the second electrodes 13. In the lower wire 11b, the parts facing the piezoelectric materials 16 are the first electrodes 12. In the fourth piezoelectric element 6, the second wire 9 extending in the Y-direction is provided on the piezoelectric material 16. In the second wire 9, the parts facing the piezoelectric materials 16 are the second electrodes 13. In the lower wire 11b, the parts facing the piezoelectric materials 16 are the first electrodes 12. In the second piezoelectric element 4 and the fourth piezoelectric element 6, the first electrodes 12 and the second electrodes 13 sandwich the piezoelectric materials 16. Similarly, in the first piezoelectric element 3 and the third piezoelectric element 5, the first electrodes 12 and the second electrodes 13 sandwich the piezoelectric materials 16.

Conducting films 17 are provided on the +X-direction sides and the −X-direction sides of the piezoelectric materials 16. At the step of forming the planar shapes of the piezoelectric materials 16, the lower wires 11 may be thinner. The conducting films 17 have a function of thickening the thinner lower wires 11 and reducing the conduction resistances.

The inorganic insulating film 7 is provided to cover the piezoelectric elements 2. For the material of the inorganic insulating film 7, an inorganic material of silicon oxide, aluminum oxide, or the like may be used. In the embodiment, for example, aluminum oxide is employed for the material of the inorganic insulating film 7.

Figure 6:
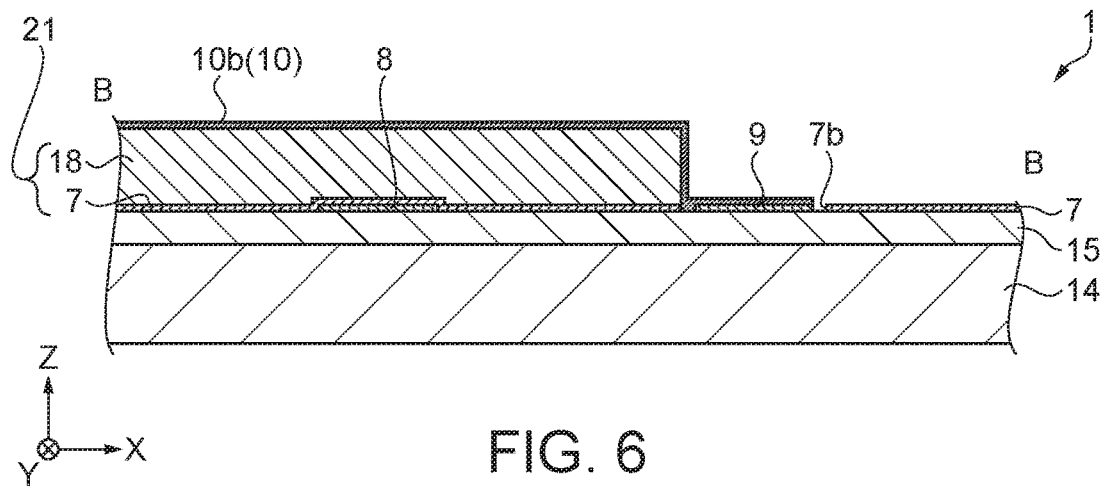
FIG. 6 is a main part schematic side sectional view showing the structure of the ultrasonic element array.

FIG. 6 is a main part schematic side sectional view showing the structure of the ultrasonic element array as seen from a section along line B-B in FIG. 1. As shown in FIG. 6, the first wire 8 is provided on the vibrating plate 15 between the first piezoelectric element 3 and the second piezoelectric element 4. The second wire 9 is provided on the vibrating plate 15 between the third piezoelectric element 5 and the fourth piezoelectric element 6. The first wire 8 and the second wire 9 are wires extending in the Y-direction.

The inorganic insulating film 7 is provided on the first wire 8, and an organic insulating film 18 as an organic film made of an organic material is provided on the inorganic insulating film 7. Further, the third wire 10b is provided on the organic insulating film 18. The inorganic insulating film 7 and the organic insulating film 18 form an insulating film 21 that insulates the first wire 8 and the third wire 10b. The insulating film 21 is located between the first wire 8 and the third wire 10b so that the first wire 8 and the third wire 10b may not be short-circuited.

The insulating film 21 has the inorganic insulating film 7 made of the inorganic material and the organic insulating film 18 made of the organic material. The inorganic insulating film 7 has moisture resistance and prevents passing of moisture. The organic insulating film 18 is a thicker film than the inorganic insulating film 7 and has electrical resistance to voltage. Therefore, short-circuit between the first wire 8 and the third wire 10b may be made harder. Further, the inorganic insulating film 7 covers the piezoelectric elements 2. When moisture penetrates the piezoelectric elements 2, the vibration characteristics are deteriorated. The inorganic insulating film 7 suppresses penetration of moisture into the piezoelectric elements 2. Therefore, the ultrasonic element array 1 may have improves resistance to moisture and voltage.

The organic insulating film 18 is provided on the inorganic insulating film 7. It is difficult to provide the inorganic insulating film 7 on the organic insulating film 18, but easy to provide the organic insulating film 18 on the inorganic insulating film 7. Therefore, the insulating film 21 may be provided with higher productivity.

The third wire 10b is connected to the second wire 9. The second wire 9 is connected to the second electrodes 13 of the third piezoelectric element 5 and the fourth piezoelectric element 6. Therefore, a voltage may be supplied from the third wire 10b to the second electrodes 13 of the third piezoelectric element 5 and the fourth piezoelectric element 6. The material of the third wires 10 is not particularly limited as long as it may supply electricity at lower resistance. In the embodiment, for example, gold is used for the material of the third wires 10.

Figure 7:
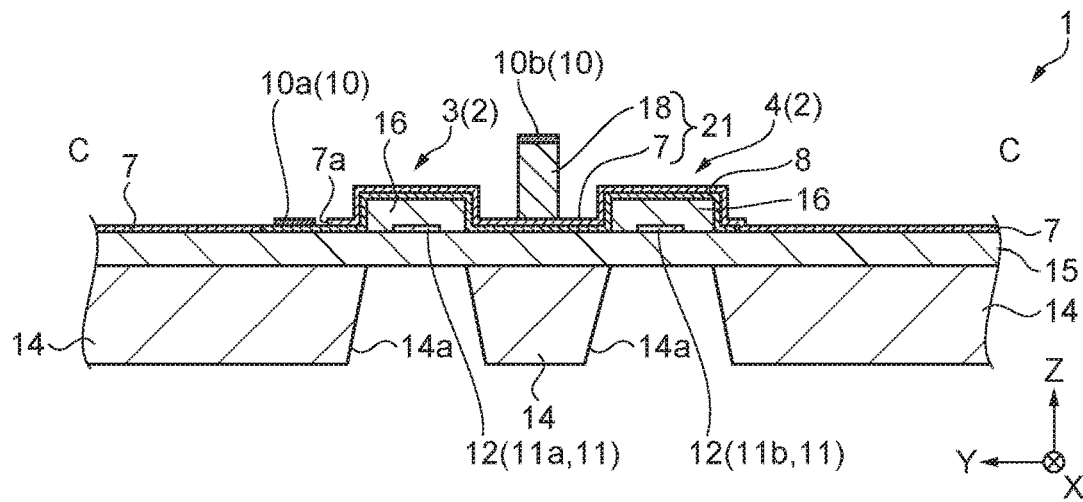
FIG. 7 is a main part schematic side sectional view showing the structure of the ultrasonic element array.

FIG. 7 is a main part schematic side sectional view showing the structure of the ultrasonic element array as seen from the section along line C-C in FIG. 1. As shown in FIG. 7, the organic insulating film 18 is provided between the inorganic insulating film 7 and the third wire 10b, but not provided in the location facing the piezoelectric elements 2. In other words, the organic insulating film 18 is provided between the first piezoelectric element 3 and the second piezoelectric element 4 adjacent to each other in the location not facing the piezoelectric elements 2. When the organic insulating film 18 overlaps with the piezoelectric elements 2, the organic insulating film 18 serves as a vibration resistance. The organic insulating film 18 does not overlap with the piezoelectric elements 2, and thereby, the piezoelectric elements 2 may efficiently output ultrasonic waves.

Figure 8:
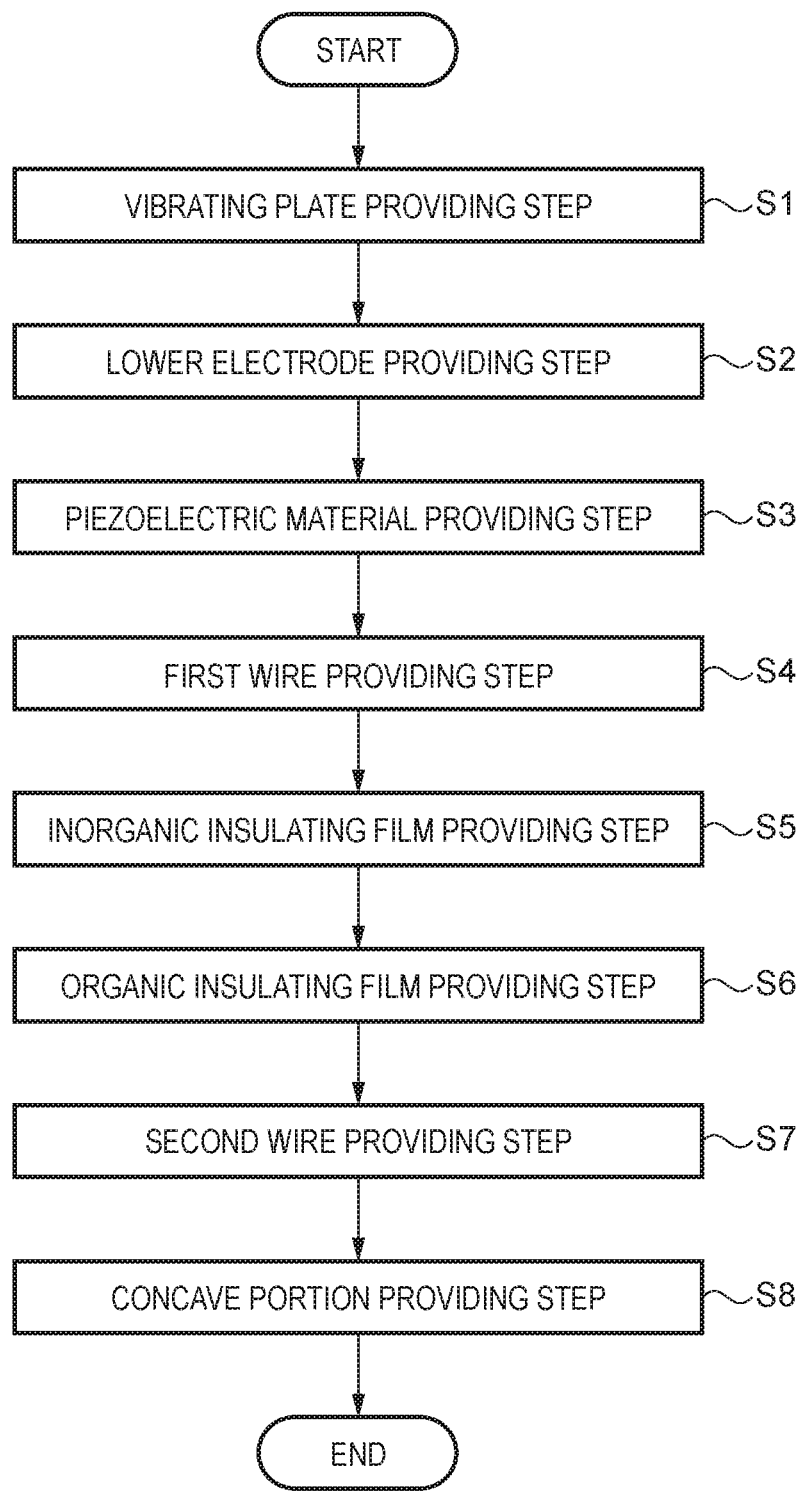
FIG. 8 is a flowchart of a manufacturing method for the ultrasonic element array.

Next, a manufacturing method for the above described ultrasonic element array 1 will be explained with reference to FIGS. 8 to 22. FIG. 8 is a flowchart of the manufacturing method for the ultrasonic element array, and FIGS. 9 to 22 are schematic diagrams for explanation of the manufacturing method for the ultrasonic element array. In the flowchart of FIG. 8, step S1 is a vibrating plate providing step. This step is a step of providing the vibrating plate 15 on the substrate 14. Then, the process moves to step S2. Step S2 is a lower electrode providing step. This step is a step of providing the lower wires 11 on the vibrating plate 15. Then, the process moves to step S3. Step S3 is a piezoelectric material providing step. This step is a step of providing the piezoelectric materials 16 on the lower wires 11. Then, the process moves to step S4. Step S4 is a first wire providing step. This step is a step of providing the first wire 8 and the second wire 9 on the piezoelectric materials 16. Then, the process moves to step S5.

Step S5 is an inorganic insulating film providing step. This step is a step of providing the inorganic insulating film 7 on the first wire 8 and the second wire 9. Then, the process moves to step S6. Step S6 is an organic insulating film providing step. This step is a step of providing the organic insulating film 18 on the inorganic insulating film 7. Then, the process moves to step S7. Step S7 is a second wire providing step. This step is a step of providing the third wires 10 on the organic insulating film 18. Then, the process moves to step S8. Step S8 is a concave portion providing step. This step is a step of providing the concave portions 14a in the substrate 14. Through the steps, the ultrasonic element array is formed.

Next, the manufacturing method will be explained in detail using FIGS. 9 to 22 in correspondence with the steps shown in FIG. 8.

Figure 9:
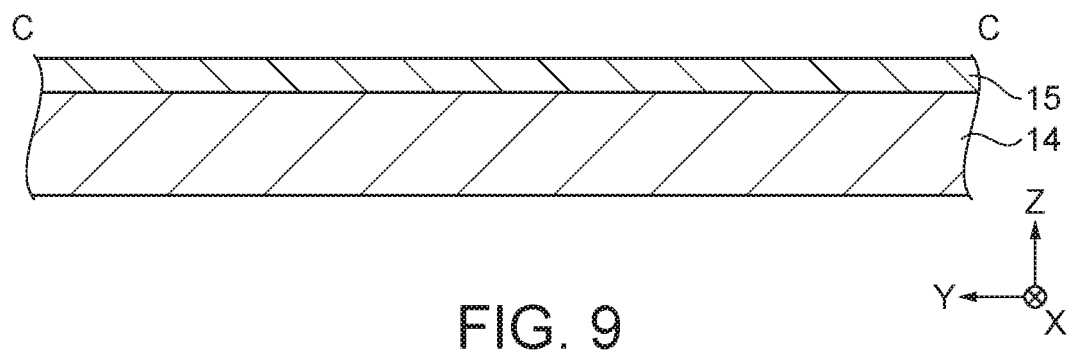
FIG. 9 is a schematic diagram for explanation of the manufacturing method for the ultrasonic element array.

FIG. 9 is the diagram corresponding to the vibrating plate providing step at step S1. As shown in FIG. 9, the substrate 14 is prepared. Then, the vibrating plate 15 is provided on the substrate 14. First, a silicon oxide ($SiO_2$) layer is stacked on the surface of the substrate 14 and a zirconium oxide ($ZrO_2$) layer is stacked on the surface of the silicon oxide layer. As a method of stacking the material, a sputtering method or CVD (chemical vapor deposition) method may be used.

Figure 10:
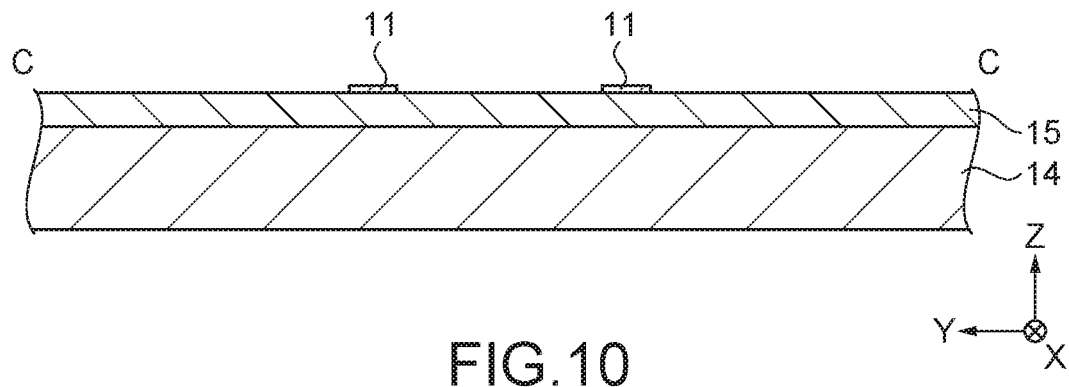
FIG. 10 is a schematic diagram for explanation of the manufacturing method for the ultrasonic element array.

FIG. 10 corresponds to the lower electrode providing step at step S2. As shown in FIG. 10, at step S2, the lower wires 11 are provided on the vibrating plate 15. First, a metal film is provided on the vibrating plate 15. In the embodiment, for example, the metal film is formed by stacking of platinum on iridium oxide. The platinum is also referred to as white gold.

The method of providing the metal film is not particularly limited, but, e.g. a sputtering method is used in the embodiment.

Then, a photosensitive resist is provided on the metal film and a mask having the shape of the lower wires 11 is placed thereon and exposed to light. Then, the photosensitive resist is removed by etching, further, the metal film is etched using the resist as a mask, and then, the resist is removed. As a result, the lower wires 11 are provided on the vibrating plate 15.

Figure 11:
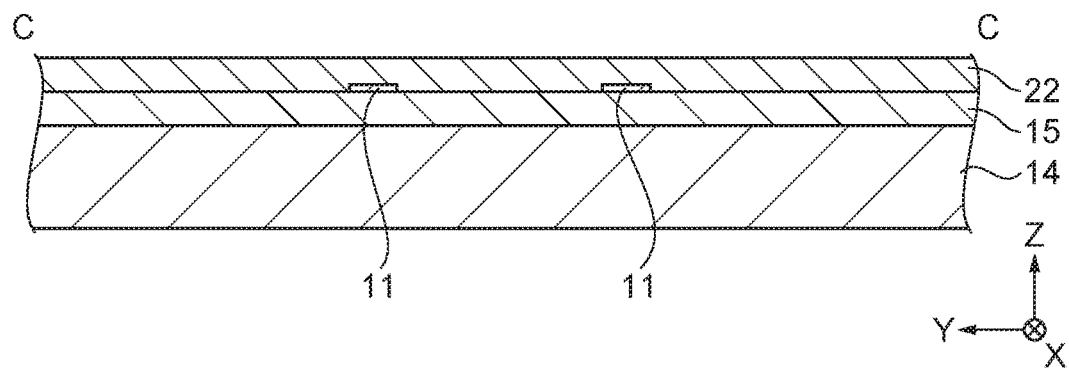
FIG. 11 is a schematic diagram for explanation of the manufacturing method for the ultrasonic element array.
Figure 12:
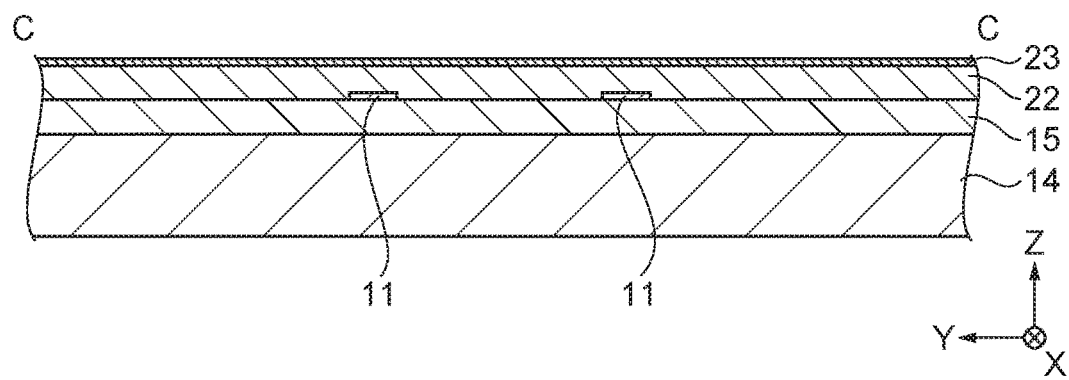
FIG. 12 is a schematic diagram for explanation of the manufacturing method for the ultrasonic element array.
Figure 13:
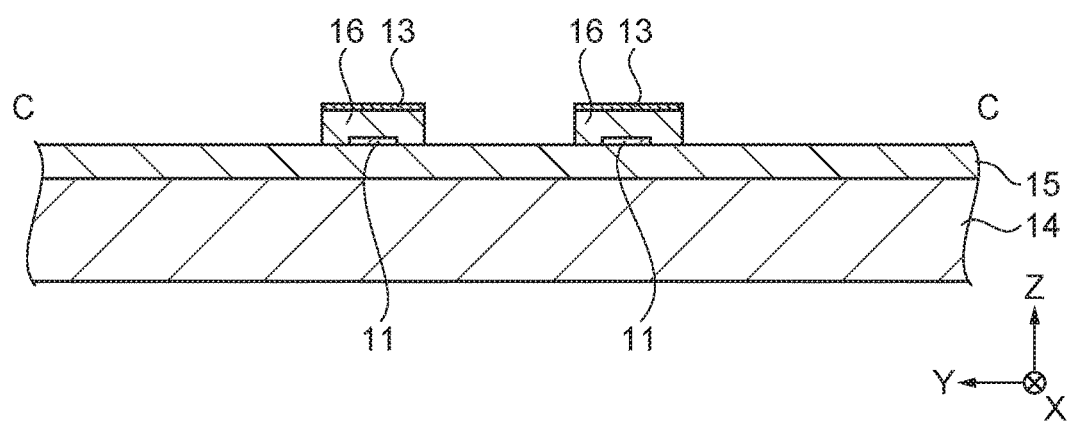
FIG. 13 is a schematic diagram for explanation of the manufacturing method for the ultrasonic element array.

FIGS. 11 to 13 correspond to the piezoelectric material providing step at step S3. As shown in FIG. 11, at step S3, a pyroelectric material layer 22 is provided. The pyroelectric material layer 22 is a layer to be a material for the piezoelectric materials 16, i.e., a PZT film layer. The pyroelectric material layer 22 is provided using a sputtering method or sol-gel method. In the sputtering method, a PZT sintered compact of specific constituents is used as a target of sputtering and an amorphous piezoelectric film precursor film is formed on the vibrating plate 15 by sputtering.

Then, the amorphous piezoelectric film precursor film is heated, crystallized, and sintered. The heating is performed in e.g. an oxygen atmosphere of oxygen or a mixed gas of oxygen and an inert gas such as argon or the like. At the heating step, the piezoelectric film precursor film is heated at a temperature from 500° C. to 700° C. in the oxygen atmosphere. The piezoelectric film precursor film is crystallized by the heating.

In the sol-gel method, a sol as a hydration complex of hydroxide of titanium, zirconium, lead, or the like to be a material for the pyroelectric material layer 22 is formed. The sol is dehydrated into a gel. This gel is heated and sintered, and thereby, the pyroelectric material layer 22 as inorganic oxide is prepared. Alkoxide or acetate of titanium, zirconium, lead, and other metal components is used as a starting material. The starting material is a sol. This sol is used as a composition mixed with an organic polymer. The organic polymer absorbs residual stress of the pyroelectric material layer 22 at drying and sintering and reduces the risk of cracking in the pyroelectric material layer 22.

Then, the sol composition is applied onto the substrate 14. For the application method, various coating methods and printing methods are used. After the application, the film of the sol composition is dried. The drying is performed by natural drying or heating at a temperature from 80° C. to 200° C. Then, the sol composition film is sintered. The sintering is performed at a temperature in a range from 300° C. to 450° C. for about 10 to 120 minutes. The sol composition film is turned into a gel by the sintering.

Then, re-sintering is performed at other temperatures. This sintering is performed at sintering temperatures in a range from 400° C. to 800° C. for about 0.1 to hours. In the re-sintering, the first stage at the temperature in the range from 400° C. to 600° C. is performed and the second stage at the temperature in the range from 600° C. to 800° C. is performed. Thereby, the porous gel thin film is transformed into a film of crystalline metal oxide. When a multilayered film of the film is formed, the steps from application to sintering of the starting material is repeated. Then, pre-annealing is performed.

As shown in FIG. 12, at step S3, an upper metal film 23 is provided. In the embodiment, for example, the upper metal film 23 is formed by stacking of an iridium film, a titanium film, and an iridium film in this order. The method of providing the upper metal film 23 is not particularly limited, however, in the embodiment, e.g. a sputtering method is used.

As shown in FIG. 13, the pyroelectric material layer 22 and the upper metal film 23 are patterned. A film made of a material for a mask film is provided on the upper metal film 23. Then, the film made of the material for the mask film is patterned by exposure to light and development using a photolithography method, and thereby, the mask film is formed. Specifically, first, a photosensitive resist film is provided and a mask in the shape of the piezoelectric materials 16 is superimposed thereon and exposed to light. Then, the resist film is removed by etching and the mask film is provided. The shape of the mask film is formed in the shape of the piezoelectric materials 16.

Parts of the pyroelectric material layer 22 are removed using a dry-etching method using the mask film as a mask. By the dry etching, the pyroelectric material layer 22 and the upper metal film 23 are etched into square shapes. In this regard, the surfaces of the lower wires 11 are slightly etched. Then, the mask film is separated using a separating liquid. As a result, the lower wires 11, the piezoelectric materials 16, and the second electrodes 13 are formed on the vibrating plate 15. Note that the second electrodes 13 are shown in the parts overlapping with the piezoelectric materials 16 of the first wire 8.

Figure 14:
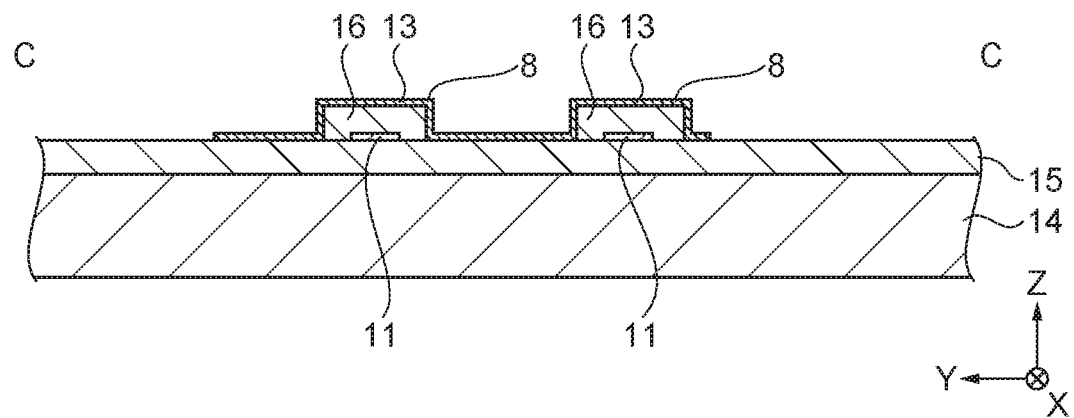
FIG. 14 is a schematic diagram for explanation of the manufacturing method for the ultrasonic element array.
Figure 15:
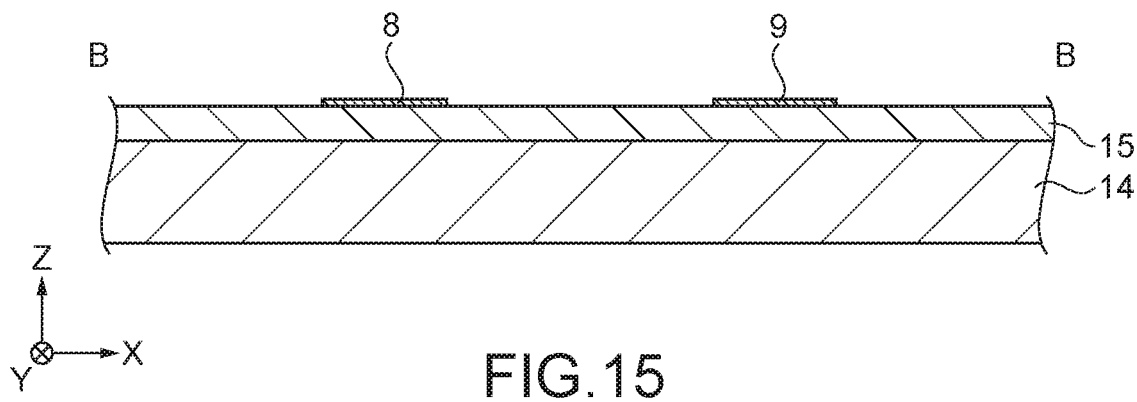
FIG. 15 is a schematic diagram for explanation of the manufacturing method for the ultrasonic element array.

FIGS. 14 and 15 are diagrams corresponding to the first wire providing step at step S4. As shown in FIGS. 14 and 15, at step S4, the first wire 8 and the second wire 9 are provided. First, a metal film is deposited. The metal film is a film to be the material of the first wire 8 and the second wire 9. The deposition method of the metal film is not particularly limited, but, in the embodiment, for example, a sputtering method is used.

Then, a film made of a photosensitive material is deposited on the metal film. Subsequently, the film is patterned by exposure to light and development using a photolithography method, and thereby, a mask film is formed. The shape of the mask film is formed in the shapes of the first wire 8 and the second wire 9. Then, the metal film is dry-etched using the mask film as a mask. As a result, the first wire 8 and the second wire 9 are formed from the metal film. The amount of over etching in the planar direction is smaller in dry etching than that in wet etching, and a fine pattern may be formed with higher accuracy.

Figure 16:
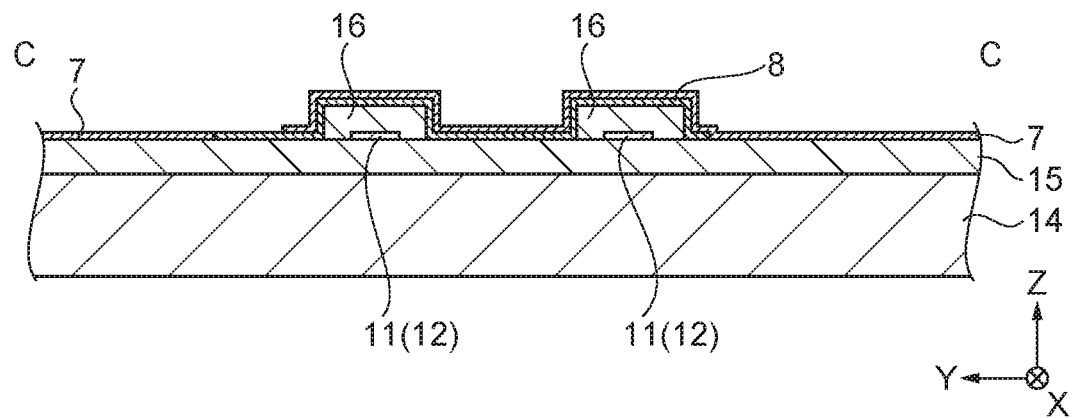
FIG. 16 is a schematic diagram for explanation of the manufacturing method for the ultrasonic element array.
Figure 17:
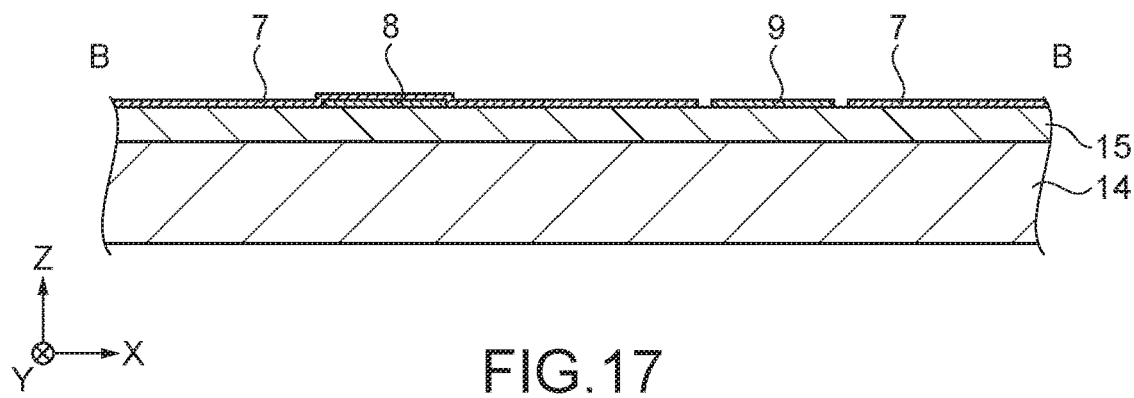
FIG. 17 is a schematic diagram for explanation of the manufacturing method for the ultrasonic element array.

FIGS. 16 and 17 are diagrams corresponding to the inorganic insulating film providing step at step S5. As shown in FIGS. 16 and 17, at step S5, the inorganic insulating film 7 is provided. First, an inorganic film is provided on the first wire 8, the second wire 9, and the plurality of piezoelectric elements 2. In the piezoelectric elements 2, the first electrodes 12, the piezoelectric materials 16, and the second electrodes 13 are stacked. The inorganic film is an alumina ($Al_2O_3$) film and deposited using a CVD method. Then, a film made of a photosensitive material is deposited. Subsequently, the film is patterned by exposure to light and development using a photolithography method, and thereby, a mask film is formed. The shape of the mask film is formed in the shapes for removing the first opening portions 7a and the second opening portions 7b. Then, the inorganic film is dry-etched using the mask film as a mask. As a result, the inorganic insulating film 7 is formed from the inorganic film.

Figure 18:
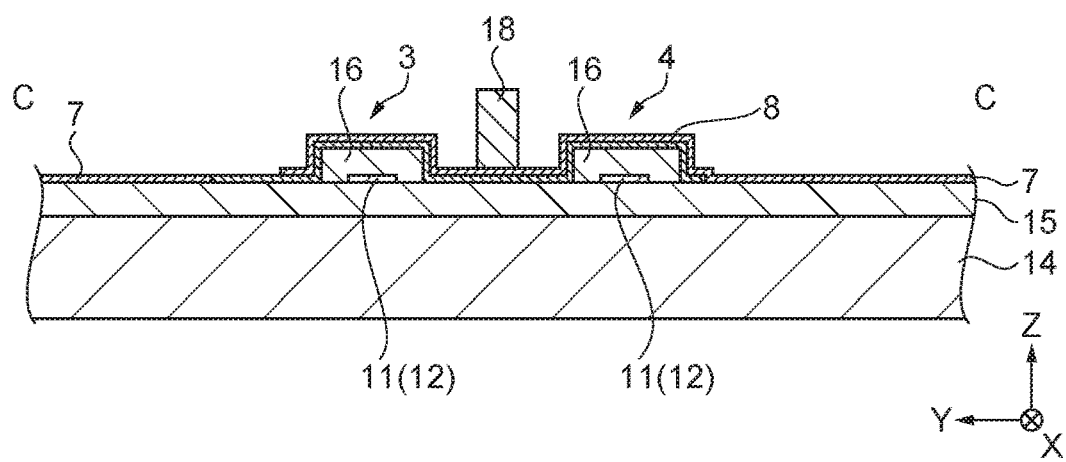
FIG. 18 is a schematic diagram for explanation of the manufacturing method for the ultrasonic element array.
Figure 19:
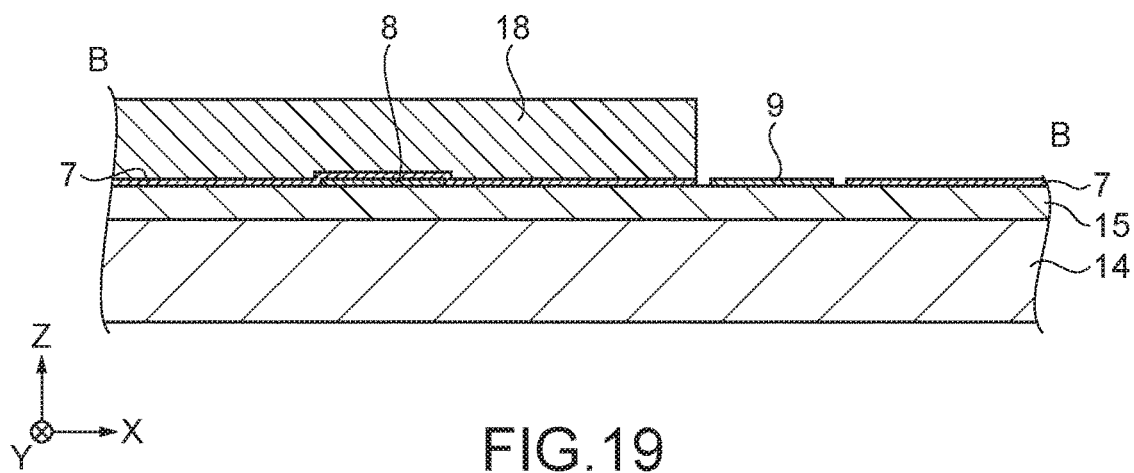
FIG. 19 is a schematic diagram for explanation of the manufacturing method for the ultrasonic element array.

FIGS. 18 and 19 are diagrams corresponding to the organic insulating film providing step. As shown in FIGS. 18 and 19, at step S6, the organic insulating film 18 is provided. First, an organic solid film is provided on the inorganic insulating film 7. The organic solid film is a photosensitive resin film. A solution formed by dissolution of a photosensitive resin material is applied to the substrate 14. The application method is not particularly limited as long as a predetermined amount of the solution is uniformly applied. In the embodiment, for example, the solution is applied using a spin coater. Then, the solution is dried and the solvent is removed.

Then, the organic solid film is exposed to light with a mask in a predetermined pattern. Further, the organic solid film is etched and patterned. Thereby, the organic solid film is removed except the part between the adjacent first piezoelectric element 3 and second piezoelectric element 4 of the locations in which the third wires 10b are provided. As a result, the organic insulating film 18 is provided in the locations not facing the second opening portions 7b on the inorganic insulating film 7. Thereby, the organic insulating film 18 is provided on the partial inorganic insulating film 7 in the location not facing the piezoelectric elements 2, but facing the first wire 8.

Figure 20:
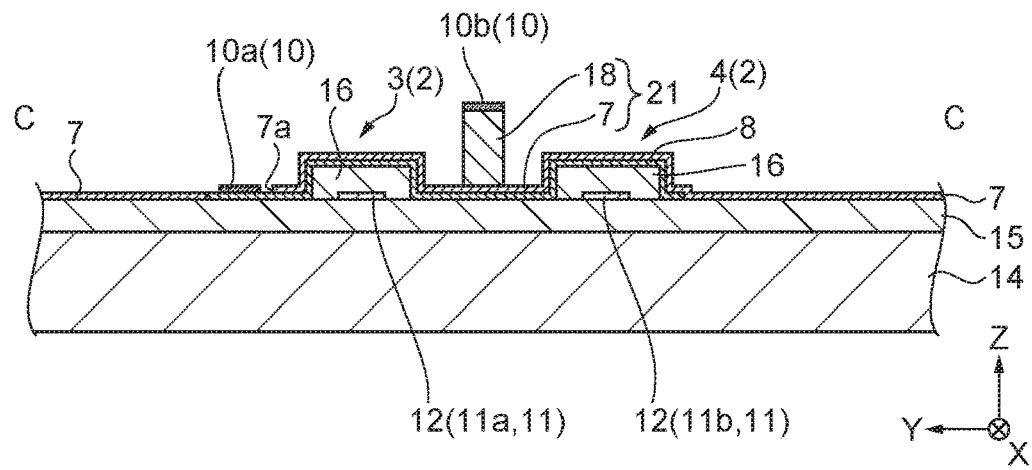
FIG. 20 is a schematic diagram for explanation of the manufacturing method for the ultrasonic element array.
Figure 21:
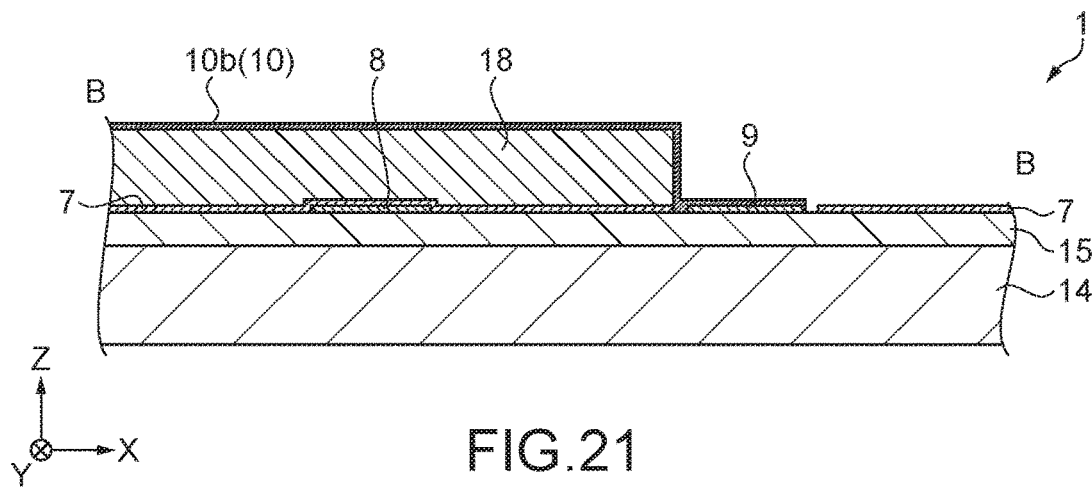
FIG. 21 is a schematic diagram for explanation of the manufacturing method for the ultrasonic element array.

FIGS. 20 and 21 are diagrams corresponding to the second wire providing step at step S7. As shown in FIGS. 20 and 21, at step S7, the third wires 10 are provided. First, a metal film is deposited. The metal film is a gold film to be a material of the third wires 10. The deposition method of the metal film is not particularly limited, but, in the embodiment, for example, a sputtering method is used.

Then, the metal film is patterned. A film made of a material for a mask film is provided on the metal film. Then, the film made of the material for the mask film is patterned by exposure to light and development using a photolithography method, and thereby, the mask film is formed. The shape of the mask film is formed in the shapes of the third wires 10. Then, the metal film is wet-etched using the mask film as a mask and the mask film is removed. As a result, the third wires 10 are formed from the metal film and the third wire 10b is provided on the organic insulating film 18.

Figure 22:
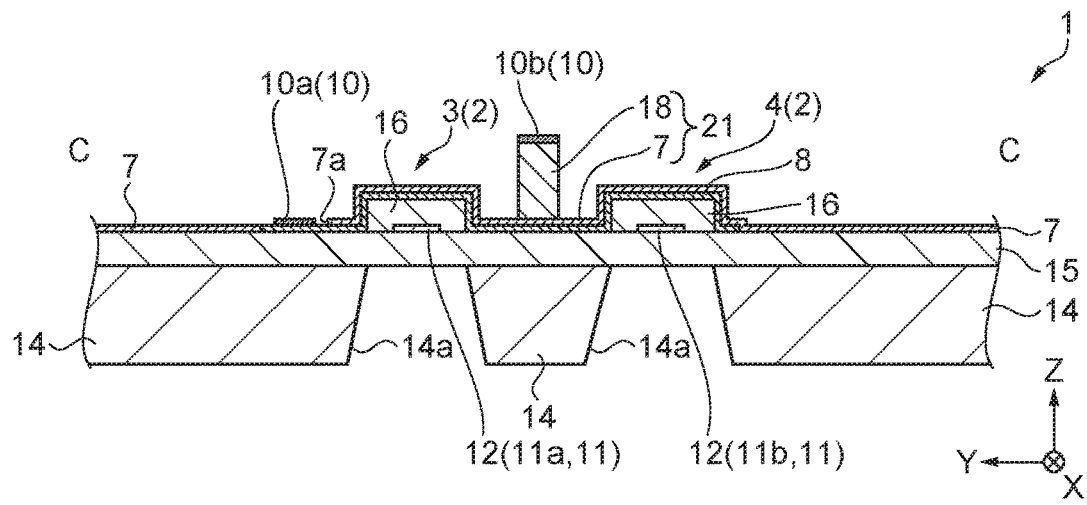
FIG. 22 is a schematic diagram for explanation of the manufacturing method for the ultrasonic element array.

FIG. 22 is a diagram corresponding to the concave portion providing step at step S8. As shown in FIG. 22, at step S8, the substrate 14 is patterned and the concave portions 14a are provided. A film made of a material for a mask film is provided on the surface on the −Z-direction side on the substrate 14. Then, the film made of the material for the mask film is patterned by exposure to light and development using a photolithography method, and thereby, the mask film is formed. The shape of the mask film is formed in a planar shape in which the concave portions 14a open. Then, the substrate 14 is etched using the mask film as a mask. As the etching method, for example, anisotropic etching using an active gas such as wet anisotropic etching or parallel plate reactive ion etching is used for etching of the substrate 14. The vibrating plate 15 functions as an etching stop layer. Then, the mask film is removed. As a result, the concave portions 14a are formed in the substrate 14. Through the above described steps, the ultrasonic element array 1 is completed.

As described above, according to the embodiment, the following advantages are obtained.

(1) According to the embodiment, the ultrasonic element array 1 includes the first piezoelectric element 3 to the fourth piezoelectric element 6, and the piezoelectric materials 16 are sandwiched between the first electrodes 12 and the second electrodes 13 in the respective piezoelectric elements 2. A voltage having a predetermined waveform is applied between the first electrodes 12 and the second electrodes 13, and thereby, the piezoelectric materials 16 vibrate and output ultrasonic waves. The first wire 8 connects the first piezoelectric element 3 and the second piezoelectric element 4. The second wire 9 connects the third piezoelectric element 5 and the fourth piezoelectric element 6. The third wire 10b connects to the second wire 9 over the first wire 8. The insulating film 21 is located between the first wire 8 and the third wire 10b so that the first wire 8 and the third wire 10b may not be short-circuited by the insulating film 21.

The insulating film 21 has the inorganic insulating film 7 made of the inorganic material and the organic insulating film 18 made of the organic material. The inorganic insulating film 7 has moisture resistance and prevents passing of moisture. The organic insulating film 18 is a thicker film than the inorganic insulating film 7 and has electrical resistance to voltage. Therefore, short-circuit between the first wire 8 and the third wire 10b may be made harder. Further, the inorganic insulating film 7 covers the piezoelectric elements 2. When moisture penetrates the piezoelectric elements 2, the vibration characteristics are deteriorated. The inorganic insulating film 7 suppresses penetration of moisture into the piezoelectric elements 2. Therefore, the ultrasonic element array 1 may have improved resistance to moisture and voltage.

(2) According to the embodiment, the organic insulating film 18 is provided in the location not facing the piezoelectric elements 2. When the organic insulating film 18 overlaps with the piezoelectric elements 2, the organic insulating film 18 serves as a vibration resistance. In the embodiment, the organic insulating film 18 does not overlap with the piezoelectric elements 2, and thereby, the piezoelectric elements 2 may efficiently output ultrasonic waves.

(3) According to the embodiment, the organic insulating film 18 is provided on the inorganic insulating film 7. It is difficult to provide the inorganic film on the organic film, but easy to provide the organic film on the inorganic film. Therefore, the insulating film 21 may be provided with higher productivity.

(4) According to the embodiment, the plurality of piezoelectric elements 2 are provided on the substrate 14. In the respective piezoelectric elements 2, the first electrodes 12, the piezoelectric materials 16, and the second electrodes 13 are stacked. Further, the respective second electrodes 13 of the first piezoelectric element 3 and second piezoelectric element 4 are connected by the first wire 8. The inorganic insulating film 7 made of the inorganic material is provided on the first wire 8 and the piezoelectric elements 2. Then, the organic insulating film 18 made of the organic material is provided on the inorganic insulating film 7. The organic insulating film 18 is provided in the location not facing the piezoelectric elements 2, but facing the first wire 8. Then, the third wire 10b is provided. The third wire 10b is provided on the organic insulating film 18.

The insulating film 21 having the inorganic insulating film 7 and the organic insulating film 18 is provided between the third wire 10b and the first wire 8, and short circuit is suppressed. Further, the inorganic insulating film 7 is provided on the piezoelectric elements 2, and entry of moisture into the piezoelectric elements 2 is suppressed. The inorganic insulating film 7 provided on the piezoelectric elements 2 and the inorganic insulating film 7 provided on the first wire 8 are provided at the same step. Accordingly, the number of steps may be reduced compared to the case where the inorganic insulating film 7 provided on the piezoelectric elements 2 and the inorganic insulating film 7 provided on the first wire 8 are provided at different steps. Therefore, the ultrasonic element array 1 in which the first wire 8 and the third wires 10 are harder to be short-circuited may be manufactured with higher productivity.

Second Embodiment

Next, one embodiment of the ultrasonic element array will be explained using a schematic plan view of an ultrasonic element array in FIG. 23. The embodiment is different from the first embodiment in that piezoelectric elements 2 in 6 rows and 12 columns are arranged. Note that the explanation of the same points as those of the first embodiment is omitted.

Figure 23:
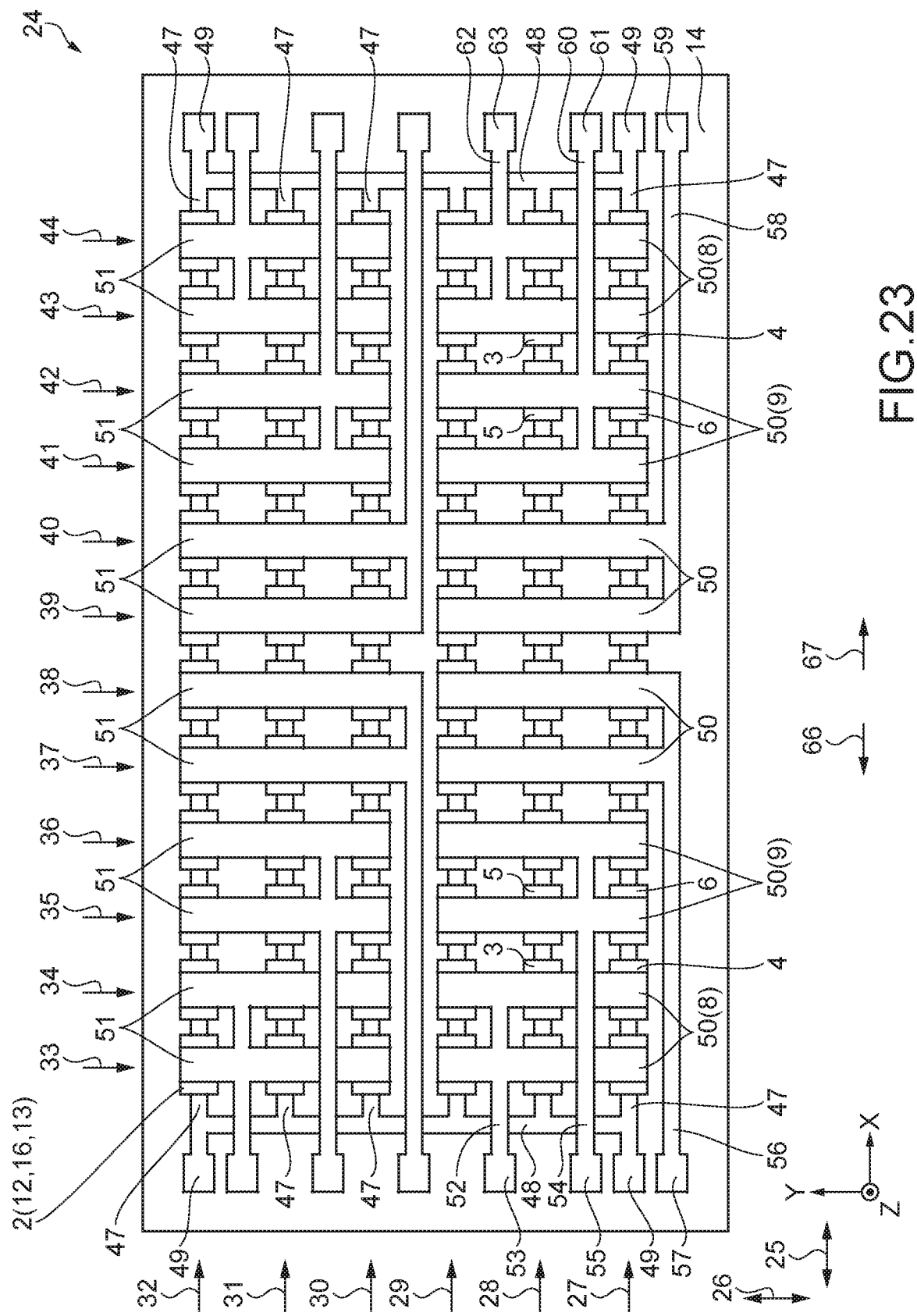
FIG. 23 is a schematic plan view of an ultrasonic element array according to the second embodiment.

In the embodiment, as shown in FIG. 23, an ultrasonic element array 24 has a rectangular planar shape and its longitudinal direction is the X-direction. The direction orthogonal to the X-direction in the plane of the substrate is the Y-direction. The direction orthogonal to the X-direction and the Y-direction is the Z-direction. In the drawing, the X-direction is referred to as "row direction 25" and the Y-direction is referred to as "column direction 26". A group of 12 piezoelectric elements 2 arranged in the row direction 25 is a single row and a group of 6 piezoelectric elements 2 arranged in the column direction 26 is a single column. In the ultrasonic element array 24, the piezoelectric elements 2 in 6 rows and 12 columns are arranged on the substrate 14.

The rows of the piezoelectric elements 2 arranged in the Y-direction are a first row 27, second row 28, third row 29, fourth row 30, fifth row 31, and sixth row 32 sequentially from the −Y-direction side. Similarly, the columns of the piezoelectric elements 2 arranged in the X-direction are a first column 33, second column 34, third column 35, fourth column 36, fifth column 37, sixth column 38, seventh column 39, eighth column 40, ninth column 41, tenth column 42, eleventh column 43, and twelfth column 44 sequentially from the −X-direction side.

The respective piezoelectric elements 2 have structures in which the first electrodes 12 and the second electrodes 13 sandwich the piezoelectric materials 16. Common wires 47 are provided on the −Z-direction side of the piezoelectric elements 2 in the respective rows and the first electrodes 12 of the respective piezoelectric elements 2 are connected to the common wires 47. Lower connecting wires 48 are provided on the −X-direction side of the first column 33 and the +X-direction side of the twelfth column 44. The lower connecting wires 48 are connected to the common wires 47 provided with respect to each row.

Terminals are arranged in the Y-direction on the −X-direction side of the lower connecting wires 48 on the −X-direction side. Two common terminals 49 of the terminals are connected to the common wires 47. Similarly, terminals are arranged in the Y-direction on the +X-direction side of the lower connecting wires 48 on the +X-direction side. Two common terminals 49 of the terminals are connected to the common wires 47. Accordingly, the potentials of the common terminals 49 are the same as the potentials of the first electrodes 12 of the respective piezoelectric elements 2.

In the piezoelectric elements 2 in the respective columns, the second electrodes 13 of the first row 27, the second row 28, and the third row 29 are connected by the same first upper electrode wires 50. Similarly, in the piezoelectric elements 2 in the respective columns, the second electrodes 13 of the fourth row 30, the fifth row 31, and the sixth row 32 are connected by the same second upper electrode wires 51.

The first upper electrode wires 50 of the first column 33 and the second column 34 are connected to a first connecting wire 52 and the first connecting wire 52 is connected to a first terminal 53. When a voltage is applied to the common terminals 49 and the first terminal 53, in the first column 33 and the second column 34, the same voltage is applied to the piezoelectric elements 2 in the first row 27, the second row 28, and the third row 29.

Similarly, the first upper electrode wires 50 of the third column 35 and the fourth column 36 are connected to a second connecting wire 54 and the second connecting wire 54 is connected to a second terminal 55. When a voltage is applied to the common terminals 49 and the second terminal 55, in the third column 35 and the fourth column 36, the same voltage is applied to the piezoelectric elements 2 in the first row 27, the second row 28, and the third row 29.

Similarly, the first upper electrode wires 50 of the fifth column 37 and the sixth column 38 are connected to a third connecting wire 56 and the third connecting wire 56 is connected to a third terminal 57. When a voltage is applied to the common terminals 49 and the third terminal 57, in the fifth column 37 and the sixth column 38, the same voltage is applied to the piezoelectric elements 2 in the first row 27, the second row 28, and the third row 29.

Similarly, the first upper electrode wires 50 of the seventh column 39 and the eighth column 40 are connected to a fourth connecting wire 58 and the fourth connecting wire 58 is connected to a fourth terminal 59. When a voltage is applied to the common terminals 49 and the fourth terminal 59, in the seventh column 39 and the eighth column 40, the same voltage is applied to the piezoelectric elements 2 in the first row 27, the second row 28, and the third row 29.

Similarly, the first upper electrode wires 50 of the ninth column 41 and the tenth column 42 are connected to a fifth connecting wire 60 and the fifth connecting wire 60 is connected to a fifth terminal 61. When a voltage is applied to the common terminals 49 and the fifth terminal 61, in the ninth column 41 and the tenth column 42, the same voltage is applied to the piezoelectric elements 2 in the first row 27, the second row 28, and the third row 29.

Similarly, the first upper electrode wires 50 of the eleventh column 43 and the twelfth column 44 are connected to a sixth connecting wire 62 and the sixth connecting wire 62 is connected to a sixth terminal 63. When a voltage is applied to the common terminals 49 and the sixth terminal 63, in the eleventh column 43 and the twelfth column 44, the same voltage is applied to the piezoelectric elements 2 in the first row 27, the second row 28, and the third row 29.

The arrangement of the connecting wires and the terminals connected to the piezoelectric elements 2 in the fourth row 30, the fifth row 31, and the sixth row 32 is the same as the arrangement of the connecting wires and the terminals connected to the piezoelectric elements 2 in the first row 27, the second row 28, and the third row 29, and their explanation is omitted.

The piezoelectric elements 2 in the second row 28 and the second column 34 are first piezoelectric elements 3, and the piezoelectric elements 2 in the first row 27 and the second column 34 are second piezoelectric elements 4. Further, the piezoelectric elements 2 in the second row 28 and the third column 35 are third piezoelectric elements 5, and the piezoelectric elements 2 in the first row 27 and the third column 35 are fourth piezoelectric elements 6. The piezoelectric elements 2 including the first piezoelectric elements 3, second piezoelectric elements 4, third piezoelectric elements 5, and fourth piezoelectric elements 6 are arranged in a matrix form. Further, only one second connecting wire 54 is provided between the first piezoelectric elements 3 and the second piezoelectric elements 4. The second connecting wire 54 corresponds to the third wire 10b of the first embodiment. Accordingly, the area occupied by the connecting wires may be made smaller compared to the arrangement in which the plurality of connecting wires are provided between the piezoelectric elements 2 in the respective rows. Therefore, the density of the piezoelectric elements 2 provided on the substrate 14 may be made higher.

The piezoelectric elements 2 in the second row 28 and the eleventh column 43 are first piezoelectric elements 3, and the piezoelectric elements 2 in the first row 27 and the eleventh column 43 are second piezoelectric elements 4. Further, the piezoelectric elements 2 in the second row 28 and the tenth column 42 are third piezoelectric elements 5, and the piezoelectric elements 2 in the first row 27 and the tenth column 42 are fourth piezoelectric elements 6. In this regard, the piezoelectric elements 2 including the first piezoelectric elements 3 and the third piezoelectric elements 5 are arranged in the row direction 25, and the piezoelectric elements 2 including the first piezoelectric elements 3 and the second piezoelectric elements 4 are arranged in the column direction 26. Further, the fifth connecting wire 60 corresponds to the third wire 10b of the first embodiment.

The −X-direction is a first direction 66 and the +X-direction is a second direction 67. The first direction 66 and the second direction 67 are opposite directions. The second connecting wire 54 extending from the first upper electrode wires 50 in the first direction 66 is provided between the adjacent first row 27 and second row 28. Further, the fifth connecting wire 60 extending from the first upper electrode wires 50 in the second direction 67 is provided between the adjacent first row 27 and second row 28.

Both the second connecting wire 54 and the fifth connecting wire 60 are located between the first row 27 and the second row 28 and correspond to the third wire 10b. The second connecting wire 54 and the fifth connecting wire 60 are separated and extend in the opposite directions to each other with respect to the connected first upper electrode wires 50. Therefore, the third wire 10b located between the first row 27 and the second row 28 functions as two series of wires of the second connecting wire 54 as a fourth wire and the fifth connecting wire 60 as a fifth wire. Further, the second connecting wire 54 connects to the first upper electrode wires 50 of the third column 35 and the fourth column 36. The fifth connecting wire 60 connects to the first upper electrode wires 50 of the ninth column 41 and the tenth column 42. Therefore, the second connecting wire 54 and the fifth connecting wire 60 may conduct different voltages in the piezoelectric elements 2 in the respective different columns.

As described above, according to the embodiment, the following advantages are obtained.

(1) According to the embodiment, the plurality of piezoelectric elements 2 are arranged in the matrix form. Further, in the second column 34, only one second connecting wire 54 is provided between the first piezoelectric element 3 and the second piezoelectric element 4. Therefore, the area occupied by the wire may be made smaller compared to the arrangement in which the plurality of wires are provided between the first piezoelectric element 3 and the second piezoelectric element 4. Therefore, the density of the piezoelectric elements 2 provided on the substrate 14 may be made higher.

(2) According to the embodiment, the piezoelectric elements 2 are arranged in the X-direction and the Y-direction. Further, the second connecting wire 54 or the fifth connecting wire 60 is provided between the adjacent first row 27 and second row 28. The second connecting wire 54 extends from the first upper electrode wires 50 in the first direction 66 of the row direction 25, and the fifth connecting wire 60 extends in the second direction 67 opposite to the first direction 66. Therefore, the wires located between the rows function as two series of wires of the second connecting wire 54 and the fifth connecting wire 60. The first upper electrode wires 50 are wires extending in the Y-direction. The second connecting wire 54 and the fifth connecting wire 60 are connected to the first upper electrode wires 50 extending in the Y-direction. Therefore, the wires located between the rows may conduct different voltages in the piezoelectric elements 2 in the different columns extending in the column direction 26. Further, different voltages may be conducted in the piezoelectric elements 2 in the other columns from the terminals provided in the first direction 66 and the terminals provided in the second direction 67.

Third Embodiment

Next, one embodiment of an ultrasonic imaging apparatus including the ultrasonic element array will be explained using a schematic perspective view showing a structure of an ultrasonic imaging apparatus in FIG. 24. Note that the explanation of the same points as those of the second embodiment is omitted.

Figure 24:
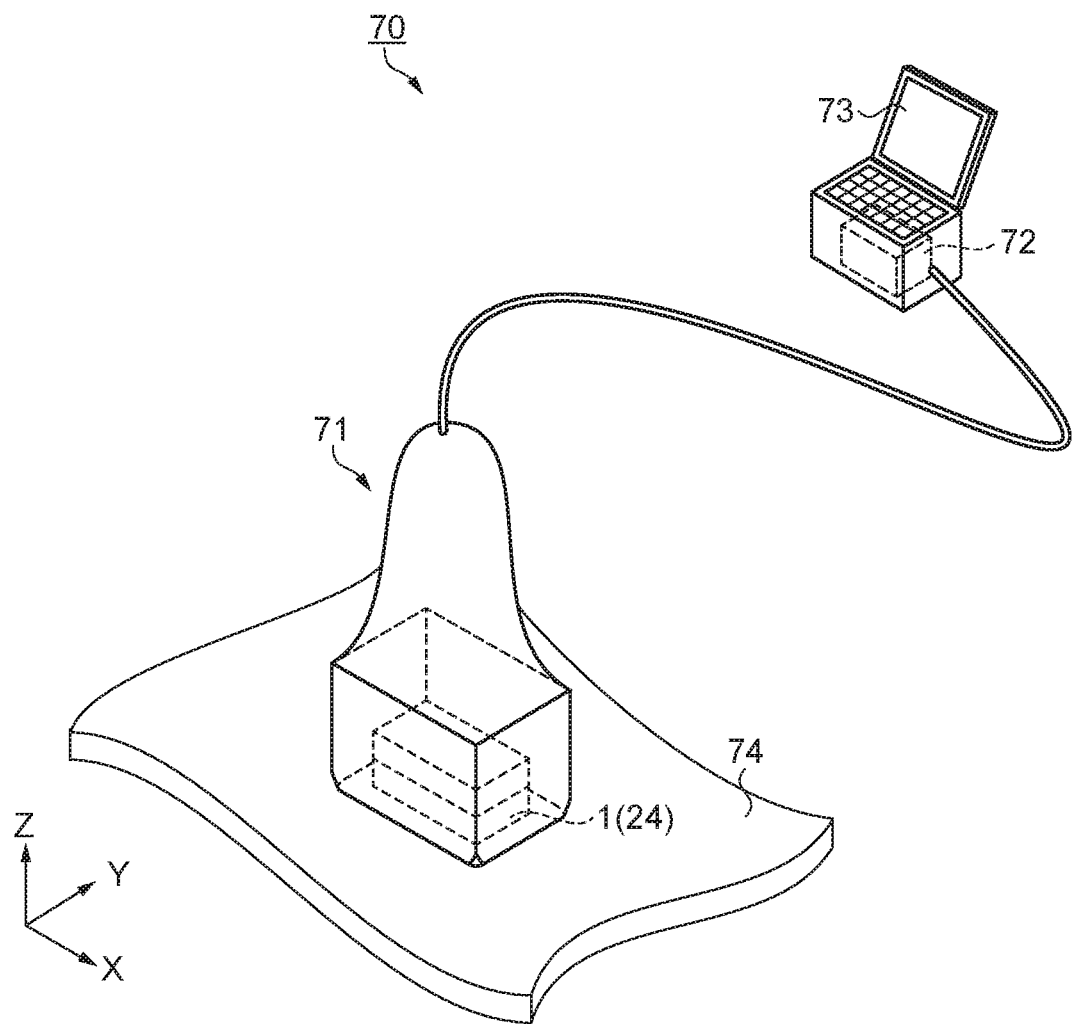
FIG. 24 is a schematic perspective view showing a structure of an ultrasonic imaging apparatus according to the third embodiment.

In the embodiment, as shown in FIG. 24, an ultrasonic imaging apparatus 70 as an ultrasonic apparatus includes an ultrasonic probe 71, an image data calculation unit 72, and an image display unit 73. The ultrasonic probe 71 transmits ultrasonic waves to a test object 74. Then, the ultrasonic probe 71 receives reflected waves reflected inside of the test object 74 and outputs reflected wave signals to the image data calculation unit 72. The image data calculation unit 72 calculates section image data of the test object 74 using the reflected wave signals. Then, the image data calculation unit 72 outputs the section images to the image display unit 73. The image display unit 73 displays the section images of the test object 74.

For the ultrasonic probe 71, the ultrasonic element array 1 or the ultrasonic element array 24 is used. The ultrasonic element array 1 and the ultrasonic element array 24 are ultrasonic element arrays with higher resistance to moisture and voltage and higher reliability. Therefore, the ultrasonic imaging apparatus 70 and the ultrasonic probe 71 may be apparatuses including the ultrasonic element arrays with higher resistance to moisture and voltage.

Note that the embodiment is not limited to the above described embodiments, but various changes and improvements can be made within the technical scope of the invention by a person having ordinary skill in the art. Modified examples will be described as below.

Modified Example 1

In the above described first embodiment, the piezoelectric elements 2 are arranged in the matrix form. The arrangement of the piezoelectric elements 2 is not limited to the matrix form. For example, a concentric arrangement or arrangement along sine wave may be employed. In addition, a radial arrangement may be employed. Also, in this case, the resistance to moisture and voltage may be made higher by providing insulating films of inorganic films and organic films between crossing wires.

Modified Example 2

In the above described first embodiment, the organic insulating film 18 is provided only between the the inorganic insulating film 7 and the third wire 10b. The organic insulating film 18 may be provided on the inorganic insulating film 7 except the locations facing the piezoelectric elements 2. The organic insulating film 18 may be used as a protective film.

Modified Example 3

In the above described second embodiment, only one wire is provided between the piezoelectric elements 2. When the number of piezoelectric elements 2 is larger, a plurality of wires may be provided between the piezoelectric elements 2. The number of piezoelectric elements 2 individually driven may be increased.

Modified Example 4

In the above described second embodiment, the connecting wires extend in the X-direction and the terminals are provided on both sides in the X-direction. In addition, the connecting wires may extend in the Y-direction in place of the X-direction and the terminals may be provided on both sides in the Y-direction. The arrangement may be conformed to the shape of the ultrasonic probe.

What is claimed is:

1. An ultrasonic element array comprising:
    a first piezoelectric element, a second piezoelectric element, a third piezoelectric element, and a fourth piezoelectric element each having a piezoelectric material sandwiched by two electrodes;
    a first wire connecting the first piezoelectric element and the second piezoelectric element;
    a second wire connecting the third piezoelectric element and the fourth piezoelectric element;
    a third wire connecting to the second wire over the first wire; and
    an insulating film located between the first wire and the third wire,
    wherein the insulating film has an inorganic film and an organic film, and
    the inorganic film covers the piezoelectric elements.

2. The ultrasonic element array according to claim 1, wherein the organic film is provided between the adjacent piezoelectric materials.

3. An ultrasonic probe comprising:
    an ultrasonic element array that outputs ultrasonic waves, the ultrasonic element array being the ultrasonic element array according to claim 2.

4. An ultrasonic apparatus comprising:
    an ultrasonic element array that outputs ultrasonic waves, the ultrasonic element array being the ultrasonic element array according to claim 2.

5. The ultrasonic element array according to claim 1, wherein the organic film is provided on the inorganic film.

6. An ultrasonic probe comprising:
    an ultrasonic element array that outputs ultrasonic waves, the ultrasonic element array being the ultrasonic element array according to claim 5.

7. An ultrasonic apparatus comprising:
    an ultrasonic element array that outputs ultrasonic waves, the ultrasonic element array being the ultrasonic element array according to claim 5.

8. The ultrasonic element array according to claim 1, wherein the piezoelectric elements including the first piezoelectric element, the second piezoelectric element, the third piezoelectric element, and the fourth piezoelectric element are arranged in a matrix form, and
    a single wire is provided between the first piezoelectric element and the second piezoelectric element.

9. An ultrasonic probe comprising:
    an ultrasonic element array that outputs ultrasonic waves, the ultrasonic element array being the ultrasonic element array according to claim 8.

10. An ultrasonic apparatus comprising:
an ultrasonic element array that outputs ultrasonic waves, the ultrasonic element array being the ultrasonic element array according to claim 8.

11. An ultrasonic probe comprising:
an ultrasonic element array that outputs ultrasonic waves, the ultrasonic element array being the ultrasonic element array according to claim 1.

12. An ultrasonic apparatus comprising:
an ultrasonic element array that outputs ultrasonic waves, the ultrasonic element array being the ultrasonic element array according to claim 1.

13. An ultrasonic element array comprising:
a first piezoelectric element, a second piezoelectric element, a third piezoelectric element, and a fourth piezoelectric element each having a piezoelectric material sandwiched by two electrodes;
a first wire connecting the first piezoelectric element and the second piezoelectric element;
a second wire connecting the third piezoelectric element and the fourth piezoelectric element;
a third wire connecting to the second wire over the first wire; and
an insulating film located between the first wire and the third wire,
wherein the insulating film has an inorganic film and an organic film, and
the inorganic film covers the piezoelectric elements,
wherein the piezoelectric elements including the first piezoelectric element, the second piezoelectric element, the third piezoelectric element, and the fourth piezoelectric element are arranged in a matrix form, and
a single wire is provided between the first piezoelectric element and the second piezoelectric element,
wherein the piezoelectric elements including the first piezoelectric element and the third piezoelectric element are arranged in a row direction and the piezoelectric elements including the first piezoelectric element and the second piezoelectric element are arranged in a column direction orthogonal to the row direction, and
a fourth wire extending in a first direction of the row direction or a fifth wire separated from the fourth wire and extending in a second direction opposite to the first direction is provided between the rows of the adjacent piezoelectric elements.

14. An ultrasonic probe comprising:
an ultrasonic element array that outputs ultrasonic waves, the ultrasonic element array being the ultrasonic element array according to claim 13.

15. An ultrasonic apparatus comprising:
an ultrasonic element array that outputs ultrasonic waves, the ultrasonic element array being the ultrasonic element array according to claim 13.

* * * * *